United States Patent
Sakai

(10) Patent No.: US 6,591,678 B2
(45) Date of Patent: Jul. 15, 2003

(54) SEMICONDUCTOR DYNAMIC QUANTITY SENSOR FOR DETECTING DYNAMIC QUANTITY IN TWO AXES WITH X-SHAPED MASS PORTION

(75) Inventor: Minekazu Sakai, Kariya (JP)

(73) Assignee: Denso Corporation, Kariya (JP)

( * ) Notice: Subject to any disclaimer, the term of this patent is extended or adjusted under 35 U.S.C. 154(b) by 106 days.

(21) Appl. No.: 09/963,409

(22) Filed: Sep. 27, 2001

(65) Prior Publication Data

US 2002/0059829 A1 May 23, 2002

(30) Foreign Application Priority Data

Oct. 24, 2000 (JP) .......................... 2000-324178

(51) Int. Cl.7 ........................ G01P 15/00; G01P 15/125
(52) U.S. Cl. .................. 73/514.36; 73/514.32
(58) Field of Search .................... 73/514.36, 514.32, 73/514.01

(56) References Cited

U.S. PATENT DOCUMENTS 5,734,105 A 3/1998 Mizukoshi

Primary Examiner—Richard A. Moller
(74) Attorney, Agent, or Firm—Posz & Bethards, PLC

(57) ABSTRACT

A dynamic quantity sensor includes a semiconductor substrate, a movable electrode, first fixed electrodes and second fixed electrodes. The movable electrode includes a mass portion and electrode portions. The mass portion includes two rod portions which cross each other in an X-shaped configuration. The first fixed electrodes form, with the electrode portions, first capacitors for detecting displacement of the movable electrode in a first direction. The second fixed electrodes form, with the electrode portions, second capacitors for detecting displacement of the movable electrode in a second direction. The movable electrode is constructed so that a ratio of its resonant frequency corresponding to the second direction to its resonant frequency corresponding to the first direction is equal to or larger than 1.41.

7 Claims, 5 Drawing Sheets

SEMICONDUCTOR DYNAMIC QUANTITY SENSOR FOR DETECTING DYNAMIC QUANTITY IN TWO AXES WITH X-SHAPED MASS PORTION

CROSS REFERENCE TO RELATED APPLICATION

This application is based on and incorporates herein by reference Japanese Patent Application No. 2000-324178 filed on Oct. 24, 2000.

BACKGROUND OF THE INVENTION

1. Field of the Invention

The present invention relates to a semiconductor dynamic quantity sensor capable of detecting a dynamic quantity in two axes.

2. Related Art

In recent years, demand for semiconductor two-axis sensors capable of detecting a dynamic quantity in two axes has grown. For example, in the air bag control system of a vehicle, acceleration should be detected in two axes corresponding to a head-on collision and a side collision.

If a sensor capable of detecting acceleration in one axis is employed for the system, at least two acceleration sensors are required. In this case, a larger space is required for disposing the two sensors, and further a control circuit is required to be installed for each of the two sensors. As a result, the problem that the entire system is large arises. It is advantageous to employ the above-described two-axis sensor as a solution of the problem.

JP-A-H9-318649 (U.S. Pat. No. 5,894,091) discloses a two-axis sensor. In the two-axis sensor, a movable electrode including a rectangular mass portion is formed in a semiconductor substrate. The mass portion is provided as a dynamic quantity sensitive part common to both the two axes. The movable electrode is connected to a stationary portion of the substrate by elastically deformable beam portions. Therefore it is movable in two axes which are mutually perpendicular on a plane parallel to the substrate.

Further four fixed electrodes are formed on the periphery of the movable electrodes. Thus, capacitors are formed between the movable electrode and the fixed electrodes for detecting displacement of the movable electrode in the two axes. However, the sensor is difficult to miniaturize, because the mass portion is rectangular and the fixed electrodes are arranged on the periphery of the rectangular mass portion.

Moreover, ideally, the mass portion should move only along the X-axis when acceleration is applied along the X-axis. However, actually, the vibration of the mass portion along the X-axis causes vibration along the Y-axis due to manufacturing variations of the beam portions. That is, the mass portion also vibrates along the Y-axis when acceleration is applied along the X-axis.

The vibration of the mass portion along the Y-axis is detected as high acceleration along the Y-axis, especially when the resonant frequency of the mass portion corresponding to the Y-axis is equal to that corresponding to the X-axis. In the case that one mass portion is provided as an acceleration sensitive part common to both the two axes, the equality between the resonant frequencies corresponding to the two axes is equivalent to the equality between the spring constants corresponding to the two-axes.

If mass portions are separately provided for the X-axis and the Y-axis, the resonant frequencies corresponding to the respective directions of the X-axis and the Y-axis differ from each other. However, the two mass portions occupy a relatively large area of the substrate.

SUMMARY OF THE INVENTION

It is therefore an object of the present invention to provide a semiconductor two-axis dynamic quantity sensor which can be readily miniaturized.

It is another object of the preset invention to provide a semiconductor two-axis dynamic quantity sensor in which the spring constants corresponding to two axes differ from each other.

A semiconductor dynamic quantity sensor according to the present invention includes a semiconductor substrate, a movable electrode, first fixed electrodes, and second fixed electrodes. The movable electrode includes a mass portion and electrode portions projecting from the center of the mass portion. The mass portion includes two rod portions which cross each other in an X-shaped configuration. Further, the movable electrode is connected to the substrate so as to be movable in response to a dynamic quantity applied thereto in a first direction and a second direction which are mutually perpendicular on a plane parallel to the substrate. The movable electrode is constructed so that a ratio of its resonant frequency corresponding to the second direction to its resonant frequency corresponding to the first direction is equal to or larger than 1.41.

The first fixed electrodes are supported by the substrate and disposed so that first capacitors for detecting displacement of the movable electrode in the first direction are formed between the first electrodes and the corresponding electrode portions. The second fixed electrodes are also supported by the substrate and disposed so that second capacitors for detecting displacement of the movable electrode in the second direction is formed between the second fixed electrode and the corresponding electrode portions.

Preferably, each of the electrode portions forms a comb-like shape projecting from the center of the mass portion. Further each of the first and second fixed electrodes also forms a comb-like shape, and is arranged so that its teeth are interdigitated with the teeth of the corresponding electrode portion. Each of the electrode portions and the first and second fixed electrodes includes a shortest tooth at a position furthest from the center of the mass portion and a longest tooth at a position proximate to the center of the mass portion.

BRIEF DESCRIPTION OF THE DRAWINGS

The invention, together with additional objects, features and advantages thereof, will be best understood from the following description, the appended claims and the accompanying drawings in which:

DETAILED DESCRIPTION OF THE PREFERRED EMBODIMENT

The present invention will be hereinafter described with reference to an embodiment and modifications.

Figure 1:
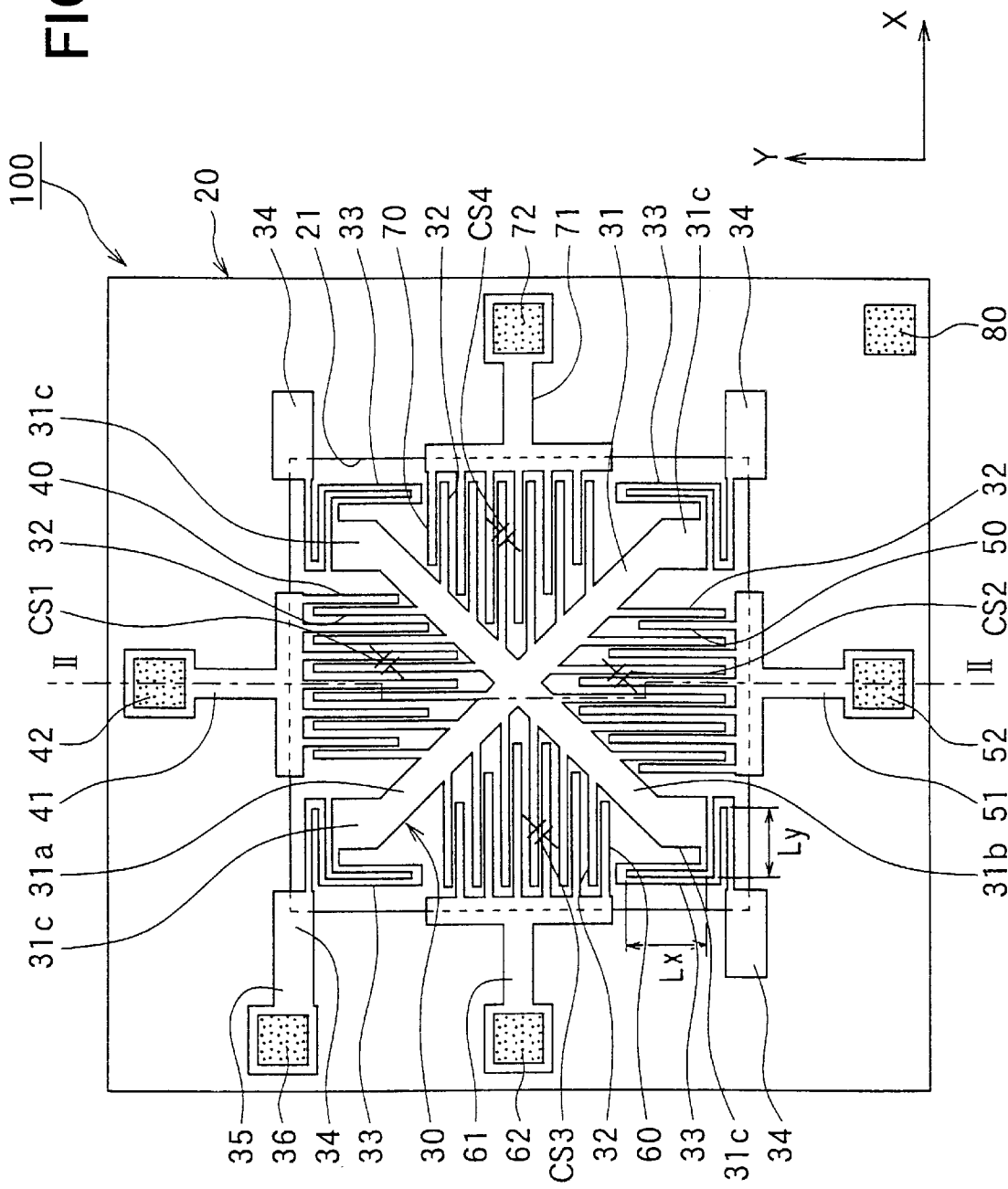
FIG. 1 is a schematic plan view of a semiconductor acceleration sensor according to an embodiment of the present invention.
Figure 2:
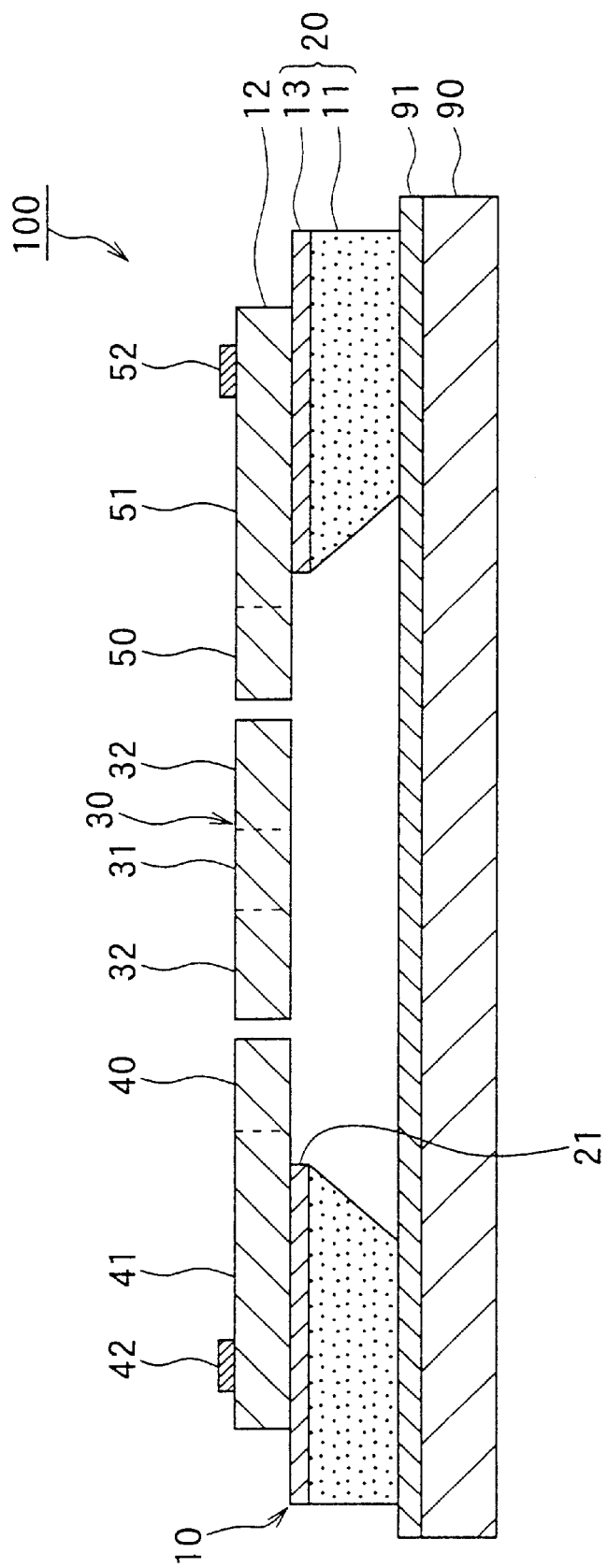
FIG. 2 is a cross-sectional view of FIG. 1 taken along the line II—II.

Referring to FIGS. 1 and 2, a semiconductor acceleration sensor 100 is formed with a rectangular SOI (silicon-on-insulator) substrate 10 which includes a oxide film 13 as an insulating layer between a first silicon substrate 11 and a second silicon substrate 12.

The second silicon substrate 12 corresponds to a semiconductor substrate with which the main part of the sensor is formed, while the first silicon substrate 11 and the oxide film 13 correspond to a supporting substrate 20 which supports the second silicon substrate 12.

A beam structure is formed with portions of the second silicon substrate 12. The beam structure includes a movable electrode 30 and fixed electrodes 40, 50, 60, 70 electrically separated from the movable electrode 30. In the supporting substrate 20, a rectangular opening 21 which passes through an area of the supporting substrate 20 corresponding to the beam structure 30–70 in the perpendicular direction is formed.

The movable electrode 30 includes a mass portion 31 and four electrode portions 32 projecting from the center of the mass portion 31. The mass portion 31 is formed with two crossed rod portions 31a, 31b. The two rod portions 31a, 31b have substantially the same width and cross each other substantially at right angles so as to form a shape of character X on a plane parallel to the second silicon substrate 12. In FIG. 1, each of the rod portions 31a, 31b extends in a direction which shifts approximately 45 degrees from X-Y axes.

The X-axis corresponds to a first direction in which acceleration is detected, while the Y-axis corresponds to a second direction in which acceleration is detected. The electrode portions 32 each form a comb-like shape, and extend from the center of the mass portion 31 in the respective four directions along the X-axis and the Y-axis.

Beam portions 33 are connected to both sides of the two rod portions 31a, 31b through connecting portions 31c. The connecting portions 31c are wider than other portions of the rod portions 31a, 31b. The beam portions 33 each include two portions extending in the first direction X and second direction Y, respectively. That is, the beam portions 33 each form a L-shape. Each of the beam portions 33 is elastically deformable due to its flexibility. The movable electrode 30 and the beam portions 33 together cover the area corresponding to the opening 21.

The movable electrode 30 is connected to anchor portions 34 at the respective four corners of the opening 21 through the beam portions 33. Each of the anchor portions 34 is formed with a portion of the second silicon substrate 12, and fixed to the supporting substrate 20. That is, the anchor portions 34 are supported by the first silicon substrate 11 through the oxide film 13. Thus, the movable electrode 30 is elastically supported by the supporting substrate 20 at the edge of the opening 21.

Accordingly, the movable electrode 30 is movable on the plane parallel to the second silicon substrate 12 in response to acceleration applied thereto as follows. The movable electrode 30 moves in the first direction X when acceleration including a component of the first direction X is applied, and returns to the original position when the acceleration is removed. The movable electrode 30 moves in the second direction X when acceleration including a component of the second direction Y is applied, and returns to the original position when the acceleration is removed.

The movable electrode 30 substantially moves only in the first direction X or only in the second direction Y at a time according to the magnitude of the components of the applied acceleration. Therefore the movable electrode 30 does not move in both the directions X, Y simultaneously, that is, it does not move diagonally.

The four fixed electrodes 40–70 are arranged on the respective sides of the opening 21 so as to surround the movable electrode 30. Specifically, two 40, 50 of the fixed electrodes are arranged as a pair of first fixed electrodes along the second direction Y, while the rest 60, 70 of the fixed electrodes are arranged as a pair of second fixed electrodes along the first direction X. Thus, the fixed electrodes 40–70 cover the area corresponding to the opening 21. As shown in FIG. 2, each of the fixed electrodes 40–70 is fixed to and cantilevered by the first silicon substrate 11 through the oxide film 13.

The fixed electrodes 40–70 each form a comb-like shape. The fixed electrodes 40–70 are arranged opposite to the electrode portions 32 of the movable electrode 30 so that the teeth of the fixed electrodes 40–70 are interdigitated with the teeth of the electrode portions 32.

Thus, first capacitors CS1, CS2 are formed between the respective first fixed electrodes 40, 50 and the corresponding electrode portions 32 of the movable electrode 30 for detecting displacement of the movable electrode 30 in the first direction X. Further, second capacitors CS3, CS4 are formed between the respective second fixed electrodes 60, 70 and the corresponding electrode portions 32 of the movable electrode 30 for detecting displacement of the movable electrode 30 in the second direction Y.

Each of the teeth of the fixed electrodes 40–70 faces the teeth of the electrode portions 32 of the movable electrode 30 on both sides. Each of the capacitors CS1–CS4 is formed on the side where a gap formed between the fixed electrode 40–70 and the electrode portion 32 is narrower.

In each of the electrode portions 32 and the fixed electrodes 40–70, its teeth have different lengths as shown in FIG. 1. That is, the tooth furthest from the center of the mass portion 31 is the shortest, while the tooth proximate to the center of the mass portion 31 is the longest. The length of the intermediate teeth gradually varies between the shortest tooth and the longest tooth. This construction (an uneven-tooth construction) is possible because the mass portion 31 has an X-shape and therefore the distance between the rod portions 31a, 31b and the edge of the opening 21 is the longest at the center of the mass portion 31 (the intersection of the rod portions 31a, 31b).

Ideally, the movable electrode 30 should not move in both the directions X, Y simultaneously as described above. However, the width, the length, and the cross-sectional shape of the beam portions 33 vary within a range of 20% due to fabricating variations. Therefore, actually, the mass portion 31 also vibrates in the second direction Y when acceleration is applied in the first direction X. The vibration of the mass portion 31 in the second direction Y would be detected as high acceleration in the second direction Y, especially when the resonant frequency fy of the mass portion 31 corresponding to the second direction Y is equal to the resonant frequency fx corresponding to the first direction X.

Figure 3:
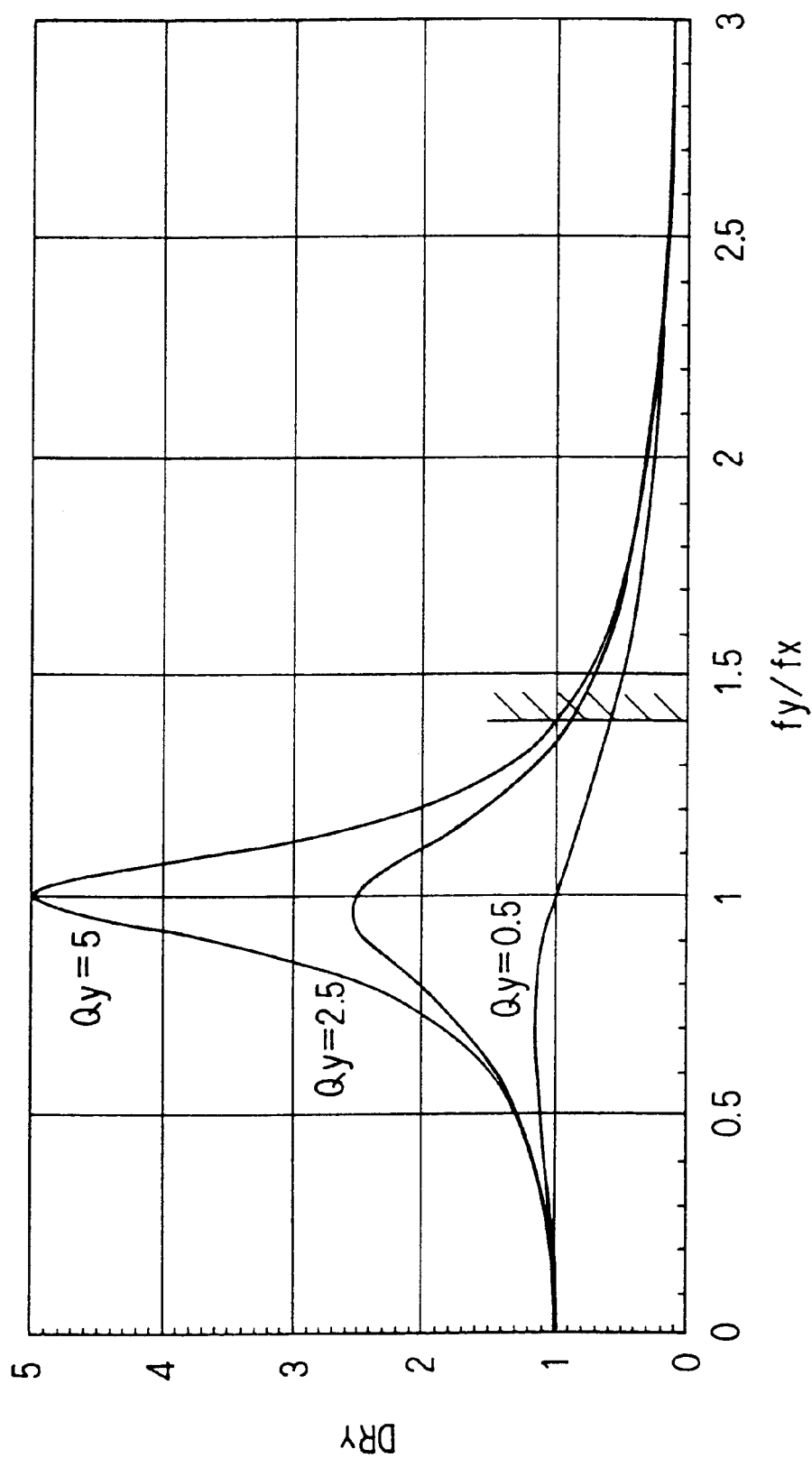
FIG. 3 is a graphical representation of the ratio of the displacement of a mass portion of the sensor in the Y-direction against a ratio of the Y-directional resonant frequency to the X-directional resonant frequency.

The ratio $DR_Y$ of the displacement of the mass portion 31 in the second direction Y to the magnitude of the Y-component of the applied acceleration varies depending on the Q-value Qy corresponding to the second direction Y and the ratio of the resonant frequency fy corresponding to the second direction Y to the resonant frequency fx corresponding to the first direction X as shown in FIG. 3. FIG. 3 shows that the displacement of the mass portion 31 in the second direction Y is not amplified regardless of the Q-value Qy if the ratio fy/fx is equal to or larger than 1.41.

Assuming that the mass of the mass portion 31 is 'm', the mathematical relationship between the resonant frequencies fy, fx and the spring constants kx, ky corresponding to the first and second directions X, Y is represented by the following formulae, respectively.

$$fx = \sqrt{kx/m}$$
$$fy = \sqrt{ky/m}$$

Therefore, if the inequality 'fy/fx≧1.41' is satisfied, the following inequality is satisfied.

$$\frac{fy}{fx} = \frac{\sqrt{ky/m}}{\sqrt{kx/m}} = \sqrt{\frac{ky}{kx}} \geq 1.41$$

Accordingly the inequality 'ky/kx≧1.99' is satisfied.

This means that the displacement of the mass portion 31 in the second direction Y is not amplified regardless of the Q-value Qy if the ratio ky/kx is equal to or larger than 1.99. That is, the spring constant ky should be equal to or larger than the spring constant kx multiplied by 1.99.

Assuming that the lengths of the beam portion 33 in the first and second directions X, Y are 'Ly' and 'Lx' respectively, the spring constants kx, ky are inversely proportional to the cube of the lengths Lx, Ly, respectively. Therefore, if the inequality 'ky/kx≧1.99' is satisfied, the inequality 'Ly/Lx≦$1.99^{-1/3}$=0.795' is satisfied. This means that the displacement of the mass portion 31 in the second direction Y is not amplified regardless of the Q-value Qy if the length Ly is equal to or shorter than the length Lx multiplied by 0.795. The sensor 100 is constructed so that the derived inequality 'Ly≦0.795·Lx' is satisfied, and therefore the length Ly is represented to be shorter than the length Lx in FIG. 1. Then, the construction of the sensor 100 also satisfies the inequalities 'fy/fx≧1.41' and 'ky/kx≧1.99'.

The electrodes 30–70 are electrically isolated from one another, and outgoing portions (wiring portions) 35, 41, 51, 61, 71 corresponding to and electrically connected to the respective electrodes 30–70 are formed as follows.

The outgoing portions 41–71 corresponding to the respective fixed electrodes 40–70 are formed with portions of the second silicon substrate 12 on the periphery of the fixed electrodes 40–70. Further, pads 42, 52, 62, 72 are electrically connected to and formed on the respective outgoing portions 41–71. That is, each of the fixed electrodes 40–70 is electrically connected to the corresponding pad 42–72 through the corresponding outgoing portion 41–71.

The outgoing portion 35 corresponding to the movable electrode 30 is also formed with a portion of the second silicon substrate 12 so as to be integrated with one of the anchor portions 34 (the upper-left anchor portion in FIG. 1). A pad 36 is also formed on and electrically connected to the outgoing portion 35. That is, the movable electrode 30 is electrically connected to the pad 36 through the outgoing portion 35.

Accordingly, each of the electrodes 30, 40–70 can be connected to the external through the corresponding outgoing portion (wiring portion) 35, 41–71 and pad 36, 42–72.

Further, a pad 80 electrically isolated from each of the electrodes 30–70 is formed on the peripheral portion of the second silicon substrate 12. This pad 80 is provided for fixing the electrical potential of the peripheral portions of the second silicon substrate 12, that is, portions other than the electrodes 30–70 on the second silicon substrate 12.

The outgoing portions 35, 41–71 and pads 36, 42–72 electrically conduct to the corresponding electrodes 30–70. The outgoing portions 35, 41–71 are electrically isolated from one another, and the pads 36, 42–72, 80 are also electrically isolated from one anther. The outgoing portions 35, 41–71 are included in the area supported by the supporting substrate 20.

The sensor 100 is fabricated using micro-machining technique as follows. First, a SOI substrate 10 is prepared. A semiconductor substrate having a face orientation of (100) may be employed as the second silicon substrate 12, for example. Next, an aluminium film is formed on the entire surface of the second silicon substrate 12 by depositing aluminum. Thereafter, the aluminium film is patterned by photolithography and etching to define the pads 36, 42–72, 80. Thus the pads 36, 42–72, 80 may be formed of aluminium, for example.

Then, a silicon nitride film is formed on the surface of the first silicon substrate 11 by plasma CVD. The silicon nitride film is patterned by photolithography and etching to define a mask for a later process of forming the opening 21.

Thereafter, a dry-etch resistant layer is formed on the second silicon substrate 12 and the pads 36, 42–72, 80, and it is patterned to define a mask for the subsequent process of forming the beam structure 30–70. Recesses reaching the silicon oxide film 13 are formed in the second silicon substrate 12 by dry etching using the mask. As a result, the pattern including the beam structure 30–70, the pads 36, 42–72, 80 and the outgoing portions shown in FIG. 1 is formed with the second silicon substrate 11.

Next, using the previously formed mask, the area of the first silicon substrate 11 corresponding to the opening 21 is removed by etching using a KOH solution or by dry-etching using a plasma etching equipment. In the case of dry-etching, the mask is simultaneously removed during the dry-etching. Thus, the area of the silicon oxide film 13 corresponding to the opening 21 is exposed.

Next, the exposed area of the silicon oxide film 13 is removed by etching using an etchant of the HF family. Thus, the opening 21 is formed, and therefore the movable electrode 30 and the fixed electrodes 40–70 are released. Then the sensor 100 shown in FIGS. 1 and 2 is completed.

The sensor 100 is glued at the backside of the first silicon substrate 11 to a package 90 via an adhesive 91 as shown in FIG. 2. For example, a polyimide resin may be employed as the adhesive 91. The package 90 is made of ceramic such as alumina. The package 90 includes a detection circuit 110 to be described later. The detection circuit 110 is electrically connected to the pads 36, 42–72, 80 by wires. The wires may be formed by wire bonding using gold or aluminium.

The sensor 100 operates as follows. If the movable electrode 30 moves in the first direction X in response to acceleration applied to the sensor 100, the applied acceleration is detected based on variation in the capacitance of first capacitors CS1, CS2.

The movable electrode 30 moves left in FIG. 1 (in the negative direction of the X-axis), if the acceleration is applied right (in the positive direction of the X-axis). With this movement, the gaps between the first fixed electrode 40 arranged on the upper side of FIG. 1 and the corresponding electrode portion 32 widen, and thereby the capacitance of the first capacitor CS1 decreases. Further the gaps between the other first fixed electrode 50 arranged on the lower side of FIG. 1 and the corresponding electrode portion 32 narrow, and thereby the capacitance of the other first capacitor CS2 increases.

Figure 4:
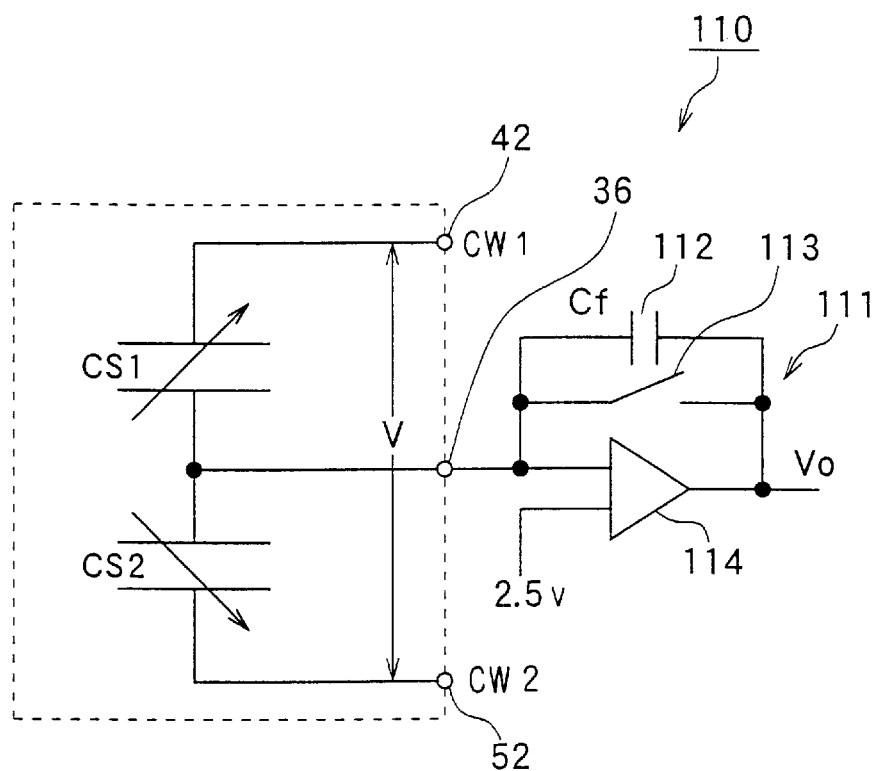
FIG. 4 is a schematic diagram of a detection circuit included in the sensor of FIG. 1.

Then the applied acceleration in the first direction X is detected based on the difference between the capacitance of the first capacitors CS1, CS2. FIG. 4 shows the detection circuit 110 for detecting the acceleration in the first direction X. The detection circuit 110 includes a switched-capacitor (SC) circuit 111 which includes a capacitor 112 of capacitance Cf, a switch 113, and a differential amplifier circuit 114. The SC circuit 111 receives, as an input, the difference between the capacitance of the first capacitors CS1, CS2, and converts it to a voltage.

Figure 5:
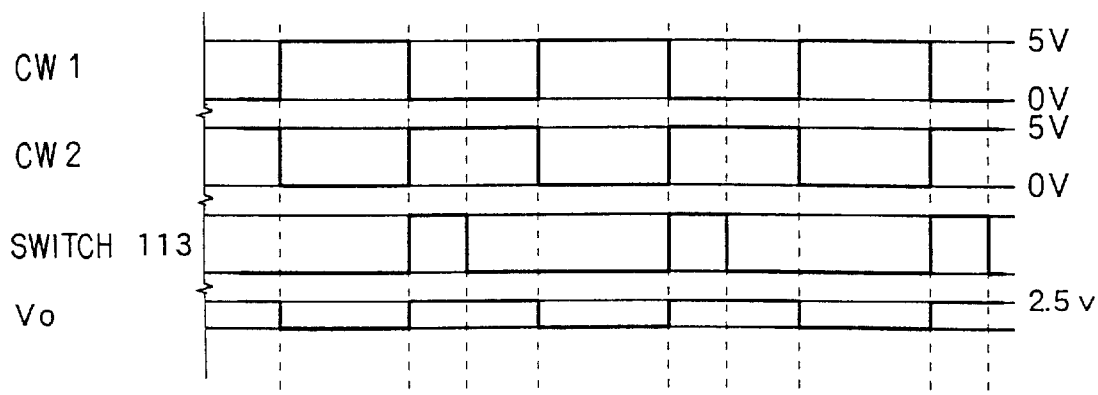
FIG. 5 is a timing chart of the detection circuit of FIG. 4.

FIG. 5 shows an example of a timing chart of the detection circuit 110. According to the timing chart, a first carrier wave CW1, which has a frequency of 100 kHz and an amplitude of 0–5 V, is inputted to the pad 42 corresponding to the first fixed electrode 40. Further, a second carrier wave CW2, which has a frequency of 100 kHz and an amplitude of 0–5 V and whose phase shifts 180 degrees from that of the first carrier wave CW1, is inputted to the pad 52 corresponding to the other first fixed electrode 50. The switch 113 is opened and closed at times shown in FIG. 5. Then a voltage V0 corresponding to the magnitude of the applied acceleration is outputted based on the difference between the capacitance of the first capacitors CS1, CS2. Assuming that the voltage between the pads 42, 52 is 'V', the voltage V0 is represented by the following formula.

$$V0=(CS1-CS2) \cdot V/Cf$$

Thus, the acceleration applied in the first direction X is detected as the voltage V0. During the detection, variation in the capacitance of the second capacitors CS3, CS4 is negligible.

On the other hand, if the movable electrode 30 moves in the second direction Y in response to acceleration applied to the sensor 100, the applied acceleration is detected based on variation in the capacitance of second capacitors CS3, CS4. The movable electrode 30 moves downward in FIG. 1 (in the negative direction of the Y-axis), if the acceleration is applied upward in FIG. 1 (in the positive direction of the Y-axis). With this movement, the gaps between the second fixed electrode 60 arranged on the left side of FIG. 1 and the corresponding electrode portion 32 widen, and thereby the capacitance of the second capacitor CS3 decreases. Further the gaps between the other second fixed electrode 70 arranged on the right side of FIG. 1 and the corresponding electrode portion 32 narrow, and thereby the capacitance of the other second capacitor CS4 increases.

Then the acceleration applied in the second direction Y is detected based on the difference between the capacitance of the second capacitors CS3, CS4. A circuit obtained by replacing the first capacitors CS1, CS2 and the corresponding pads 42, 52 with the second capacitors CS3, CS4 and the corresponding pads 62, 72 in the detection circuit 110 of FIG. 4 may be employed as a detection circuit for detecting the acceleration in the second direction Y. The detection circuit may also operate at the timing shown in FIG. 5.

Then a voltage V0 corresponding to the magnitude of the applied acceleration is outputted based on the difference between the capacitance of the second capacitors CS3, CS4. Assuming that the voltage between the pads 62, 72 is 'V', the voltage V0 is represented by the following formula similarly to the detection in the first direction X.

$$V0=(CS3-CS4) \cdot V/Cf$$

Thus, the acceleration applied in the second direction Y is detected as the voltage V0. During the detection, variation in the capacitance of the first capacitors CS1, CS2 is negligible.

The effects of the semiconductor acceleration sensor according to the present embodiment are as follows. Since the mass portion 31 is formed generally in the X-shaped configuration so that recesses are formed between the rod portions 31a, 31b toward the center of the mass portion 31, the electrode portions 32 of the movable electrode 30 and the fixed electrodes 40–70 can be arranged as close to the center of the movable electrode 30 as possible in comparison with the conventional sensor including a rectangular mass portion. Therefore, the sensor 100 can be readily miniaturized.

Further, because the two rod portions 31a, 31b of the mass portion 31 have substantially the same width, the symmetric property of the mass portion 31 is firmly maintained in this sensor 100 although the weight of the electrode portions 32 accounts for most of the entire weight of the movable electrode 30.

Moreover, because the mass portion 31 has an X-shape, the gravity point of the mass portion 31 does not easily shift from the intersection of the rod portions 31a, 31b even if the size of the mass portion 31 varies due to fabricating variations. That is, the high sensitivity of the sensor 100 is ensured for each of the two axes without being adversely affected by the fabricating variations. Therefore, the sensor 100 can accurately detect acceleration applied thereto along one of the axes without detecting the component of the acceleration along the other of the axes at a time.

Further, because the connecting portions 31c of the rod portions 31a, 31b are wider than the other portions of the rod portions 31a, 31b and therefore have higher rigidity, the connecting portions 31c do not easily deform even when the beam portions 33 deform. Accordingly, the unwanted vibration of the movable electrode 30 is suppressed when the acceleration is applied to the sensor 100, and thereby the good displacement property of the movable electrode 30 is provided.

Figure 6:
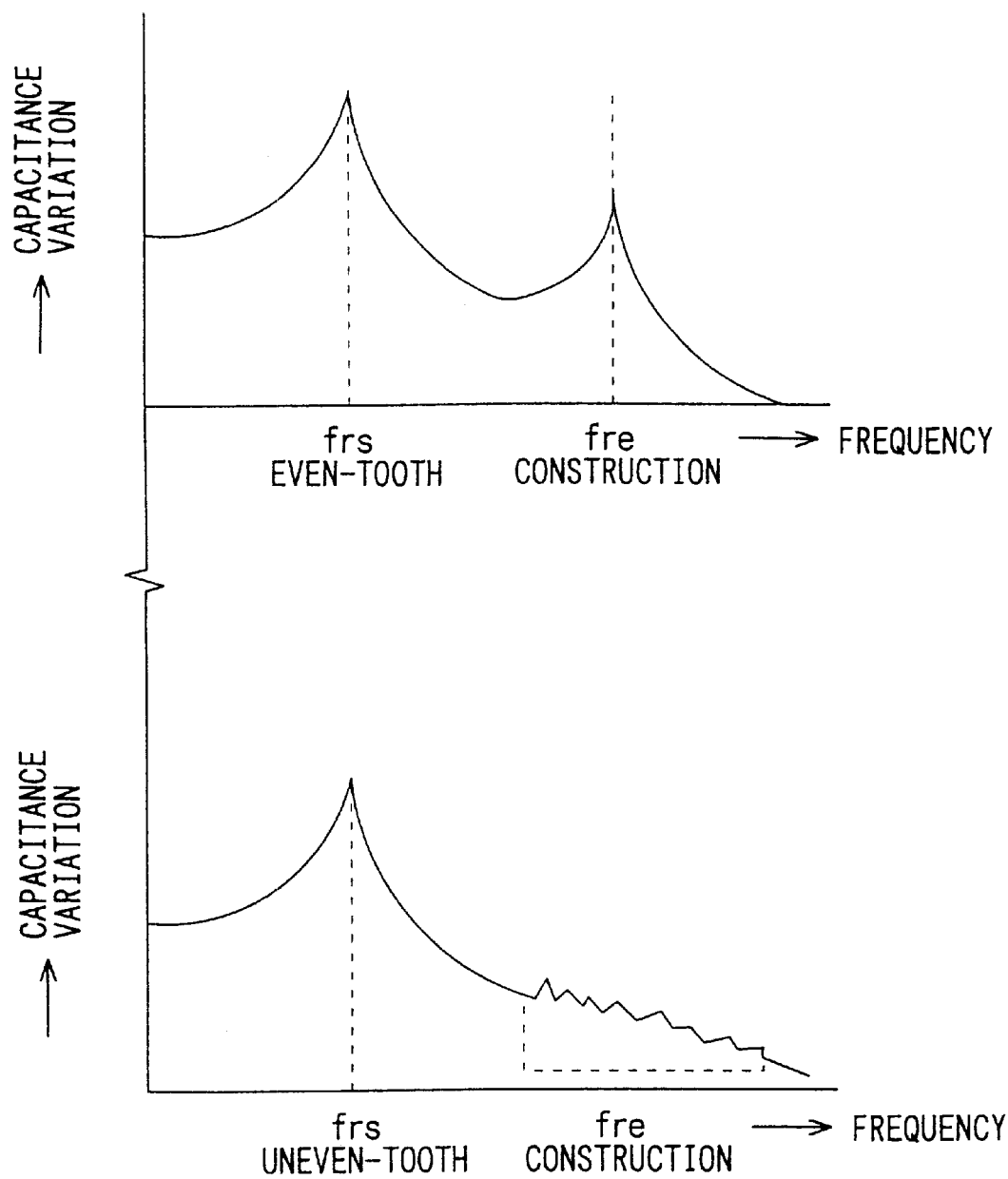
FIG. 6 is a graphical representation of capacitance variations against the oscillation frequency of a movable electrode of the sensor in the cases of an even-tooth construction and an uneven-tooth construction, respectively.

The uneven-tooth construction of the sensor 100 provides a noise reduction effect shown in FIG. 6. If acceleration is applied to the sensor 100 due to a vehicle collision, the movable electrode 30 resonates at a predetermined frequency frs (i.e., resonant frequency of the sensor 100) in the first direction X or in the second direction Y. Each of the comb-shaped electrodes 32, 40–70 also resonates at its own natural frequency fre (i.e., resonant frequency of the electrode 32, 40–70 ) in response to the applied acceleration.

If the sensor has an even-tooth construction in which each tooth of the comb-shaped electrodes has the same length, each tooth of the electrodes has substantially the same natural frequency. Therefore peaks appear in capacitance variations not only at the resonant frequency frs of the sensor but also at the resonant frequency fre of the electrodes as shown in FIG. 6. The peak corresponding to the resonant frequency fre of the electrodes, which is set to be higher than the resonant frequency frs of the sensor, is unwanted noise. For improving the precision of the sensor, the noise should be removed.

According to the uneven-tooth construction of the present sensor 100, each tooth of the comb-shaped electrodes 32, 40–70 may have different natural frequency. Therefore the natural frequency of the entire electrode portions 32 of the movable electrode 30 and the natural frequency of the entire fixed electrodes 40–70 are distributed over a range. Accordingly, as shown in FIG. 6, the peak corresponding to the resonant frequency fre of the electrodes is distributed over the range and lowered.

Moreover, because the ratio ky/kx of the spring constants kx, ky corresponding to the first and second directions X, Y is set to a value equal to or larger than 1.99, the displacement of the mass portion 31 in the second direction Y is not amplified regardless of the Q-value Qy when acceleration is applied to the sensor 100 in the first direction X.

(Modifications)

The sensor 100 may employ an even-tooth construction instead of the uneven-tooth construction. That is, each tooth of the electrodes 32, 40–70 may have the same length. This construction is accomplished by forming a portion which connects the fixed electrodes 40–70 to the supporting substrate 20 in a convex shape which curves toward the center of the mass portion 31, that is, parallels the X-shape of the mass portion 31.

In the sensor 100, each of the rod portions 31a, 31b of the mass portion 31 may have a different width on condition that symmetric property and good displacement property are maintained.

Moreover, rod portions 31a, 31b do not always need to cross each other substantially at right angles. For example, the angles between rod portions 31a, 31b corresponding to the first capacitors CS1 CS2 may be obtuse angles, and the angles corresponding to the second capacitors CS3, CS4 may be acute angles. Thus, the number of the teeth of the comb-shaped electrodes 32, 40, 50 which form the first capacitors CS1, CS2 can be increased, that is, the capacitance of the first capacitors CS1, CS2 can be increased.

Further in the sensor 100, referring to FIG. 3, the resonant frequencies fx, fy corresponding to the first and second directions X, Y do not need to strictly satisfy the inequality fy/fx≧1.41, if the Q-value Qy corresponding to the second direction Y is sufficiently low. In this case, assuming that the ratio fy/fx is 'Z', only the following equality should be satisfied.

$$\frac{1}{(1-Z^2)+(Z/Qy)^2} \leq 1$$

If the above inequality is satisfied, the displacement of the mass portion 31 in the second direction Y is not amplified The opening 21 formed on the supporting substrate 20 may be a geometrical shape other than a rectangle. Moreover, the opening 21 does not always need to pass through the supporting substrate 20, that is, a recess which passes through only the oxide film 13 may be formed on the supporting substrate 20 instead of the opening 21. Such a recess is formed by removing an appropriate portion of the oxide film 13 by sacrificial layer etching. Thus the recess is formed in the oxide film 13 leaving the first silicon substrate 11 intact.

Moreover, the sensor 100 does not always need to include the supporting substrate 20 for supporting the second silicon substrate 12. For example, a single-layer silicon substrate may be employed instead of the SOI substrate 10.

The present invention can be used as a sensor other than an acceleration sensor. For example, the present invention can be used as an angular velocity sensor as follows. A voltage is applied between the electrode portions 32 and the second fixed electrodes 60, 70 of the sensor 100 so that the movable electrode 30 is driven to vibrate in the second direction Y. During the vibration, if an angular velocity is applied about the axis perpendicular to the first and second directions X, Y, a Coriolis force is generated to vibrate the movable electrode 30 in the first direction X. This Coriolis force in the first direction X is detected as variation in the capacitance of the first capacitors CS1, CS2. Thus the applied angular velocity is detected by the sensor 100.

What is claimed is:

1. A dynamic quantity sensor comprising:

a substrate;

a movable electrode which is connected to said substrate so as to be movable in response to a dynamic quantity applied thereto in a first direction and a second direction which are mutually perpendicular on a plane parallel to said substrate;

a first fixed electrode which is supported by said substrate and disposed so that a first variable capacitor for detecting displacement of said movable electrode in said first direction is formed between said movable electrode and said first fixed electrode; and a second fixed electrode which is supported by said substrate and disposed so that a second variable capacitor for detecting displacement of said movable electrode in said second direction is formed between said movable electrode and said second fixed electrode, wherein said movable electrode comprises a mass portion which includes two rod portions which cross each other in an X-shaped configuration, and an electrode portion projecting from a center of said mass portion, wherein said first fixed electrode is arranged opposite to said electrode portion so that said first variable capacitor is formed between said electrode portion and said first fixed electrode, and wherein said second fixed electrode is arranged opposite to said electrode portion so that said second variable capacitor is formed between said electrode portion and said second fixed electrode.

2. A dynamic quantity sensor according to claim 1, wherein the rod portions have substantially a same width.

3. A dynamic quantity sensor according to claim 1 further comprising:

an elastically deformable beam portion which connects either end of each of said rod portions to the said substrate so that said movable electrode is movable in said fist direction and said second direction, wherein each of said rod portions includes a connecting portion which connects with said beam portion and is wider than other portions of said rod portions.

4. A dynamic quantity sensor according to claim 1, wherein:

said electrode portion forms a comb-like shape projecting from the center of said mass portion;

each of said first fixed electrode and said second fixed electrode forms a comb-like shape and is arranged so that teeth of said electrode are interdigitated with teeth of said electrode portion; and each of said electrode portion and said first and second fixed electrodes includes a shortest tooth at a position furthest from the center of said mass portion and a longest tooth at a position proximate to the center of said mass portion.

5. A dynamic quantity sensor according to claim 1, wherein said movable electrode is constructed so that its resonant frequencies fx, fy corresponding to said first and second directions and its Q-value Qy corresponding to said second direction satisfy an inequality $$\frac{1}{\{1-(fy/fx)^2\}^2+\left\{\frac{(fy/fx)}{Qy}\right\}^2} \leq 1.$$

6. A dynamic quantity sensor according to claim 1, wherein said movable electrode is constructed so that a ratio of its resonant frequency corresponding to said second direction to its resonant frequency corresponding to said first direction is equal to or larger than 1.41.

7. A dynamic quantity sensor comprising:

a substrate;

a movable electrode which includes a mass portion and an electrode portion projecting from said mass portion and is connected to said substrate so as to be movable in response to a dynamic quantity applied thereto in a first direction and a second direction which are mutually perpendicular on a plane parallel to said substrate;

a first fixed electrode which is supported by said substrate and disposed so that a first variable capacitor for detecting displacement of said movable electrode in said first direction is formed between said electrode portion and said first fixed electrode; and a second fixed electrode which is supported by said substrate and disposed so that a second variable capacitor for detecting displacement of said movable electrode in said second direction is formed between said electrode portion and said second fixed electrode, wherein said movable electrode is constructed so that a ratio of its resonant frequency corresponding to said second direction to its resonant frequency corresponding to said first direction is equal to or larger than 1.41.

* * * * *